United States Patent
Taylor

(10) Patent No.: US 8,899,993 B2
(45) Date of Patent: Dec. 2, 2014

(54) INTERPOSER PLATE

(71) Applicant: Amphenol InterCon Systems, Inc., Harrisburg, PA (US)

(72) Inventor: Paul R. Taylor, Mechanicsburg, PA (US)

(73) Assignee: Amphenol InterCon Systems, Inc., Harrisburg, PA (US)

(*) Notice: Subject to any disclaimer, the term of this patent is extended or adjusted under 35 U.S.C. 154(b) by 22 days.

(21) Appl. No.: 13/869,069

(22) Filed: Apr. 24, 2013

(65) Prior Publication Data

US 2014/0045350 A1   Feb. 13, 2014

Related U.S. Application Data

(60) Provisional application No. 61/779,374, filed on Mar. 13, 2013, provisional application No. 61/680,580, filed on Aug. 7, 2012.

(51) Int. Cl.
| | | |
|---|---|---|
| H01R 12/57 | (2011.01) | |
| H01R 13/24 | (2006.01) | |
| H01R 43/16 | (2006.01) | |
| H01R 13/41 | (2006.01) | |
| H05K 7/10 | (2006.01) | |
| H01R 12/70 | (2011.01) | |

(52) U.S. Cl.
CPC .............. *H01R 13/24* (2013.01); *H01R 43/16* (2013.01); *H01R 13/2442* (2013.01); *H01R 13/41* (2013.01); *H05K 7/10* (2013.01); *H01R 12/57* (2013.01); *H01R 12/7076* (2013.01)
USPC .......................................... 439/66

(58) Field of Classification Search
USPC .............................. 439/66, 91, 81, 71, 65, 886
See application file for complete search history.

(56) References Cited

U.S. PATENT DOCUMENTS

| | | | | |
|---|---|---|---|---|
| 4,464,007 | A * | 8/1984 | Parmer | 439/389 |
| 4,647,124 | A | 3/1987 | Kandybowski | |
| 4,762,507 | A * | 8/1988 | Rudy et al. | 439/595 |
| 5,094,634 | A | 3/1992 | Dixon et al. | |
| 5,571,033 | A * | 11/1996 | Kinsey et al. | 439/595 |
| 6,358,068 | B1 | 3/2002 | Houtz | |
| 6,528,984 | B2 * | 3/2003 | Beaman et al. | 324/755.08 |
| 6,776,624 | B2 * | 8/2004 | Suematsu | 439/71 |
| 6,945,788 | B2 | 9/2005 | Trout et al. | |
| 6,971,885 | B2 * | 12/2005 | Mowry | 439/66 |
| 6,981,879 | B2 * | 1/2006 | Kuczynski et al. | 439/66 |
| 7,044,746 | B2 | 5/2006 | Copper et al. | |
| 7,059,869 | B2 | 6/2006 | Wertz et al. | |
| 7,083,429 | B2 | 8/2006 | Hashimoto et al. | |
| 7,147,489 | B1 | 12/2006 | Lin | |
| 7,263,770 | B2 | 9/2007 | Mendenhall et al. | |
| 7,291,021 | B2 | 11/2007 | Shirai et al. | |
| 7,297,007 | B2 | 11/2007 | Hao | |
| 7,322,829 | B2 | 1/2008 | Ma | |
| 7,645,164 | B1 * | 1/2010 | Ju | 439/591 |
| 7,674,114 | B2 * | 3/2010 | Tanaka et al. | 439/74 |
| 7,695,288 | B2 | 4/2010 | Ma et al. | |
| 8,147,256 | B2 | 4/2012 | Jin | |
| 8,385,079 | B2 * | 2/2013 | Choi et al. | 361/783 |
| 8,741,667 | B2 * | 6/2014 | Hembree et al. | 438/15 |
| 2002/0022383 | A1 * | 2/2002 | Sakata et al. | 439/66 |
| 2014/0045350 | A1 * | 2/2014 | Taylor | 439/66 |

* cited by examiner

*Primary Examiner* — Alexander Gilman

(74) *Attorney, Agent, or Firm* — Hooker & Habib, P.C.

(57) ABSTRACT

The disclosure relates to interposer assembly plates with large numbers of closely spaced contact apertures extending through the plates and contact members inserted into and retained in the apertures.

23 Claims, 7 Drawing Sheets

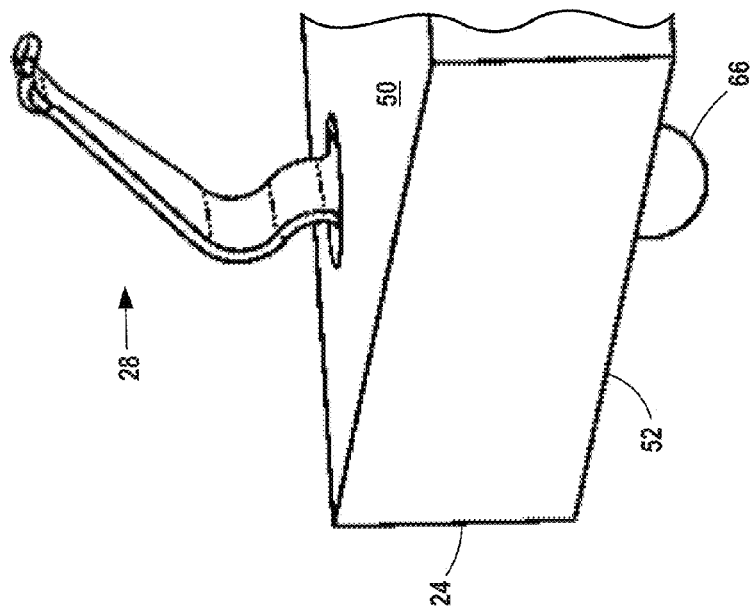
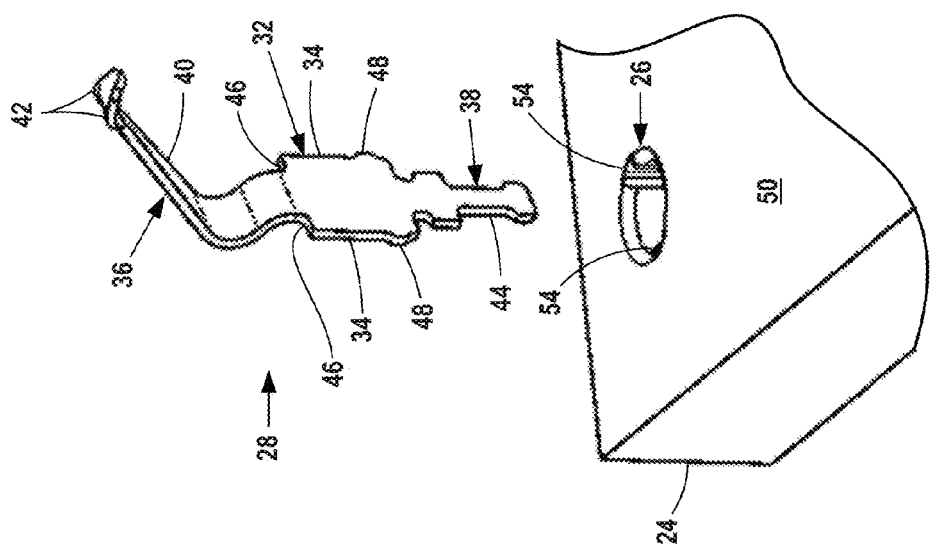

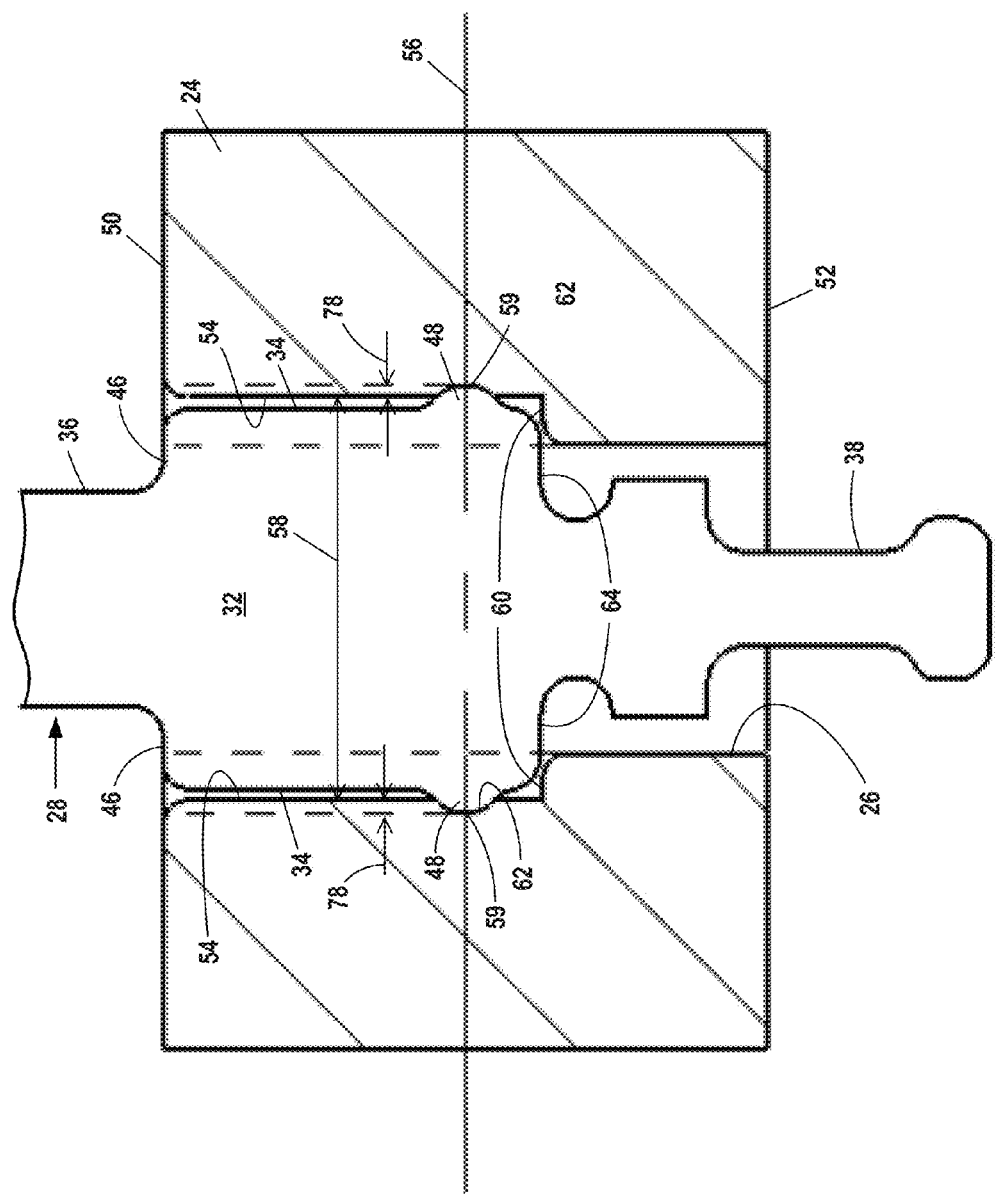

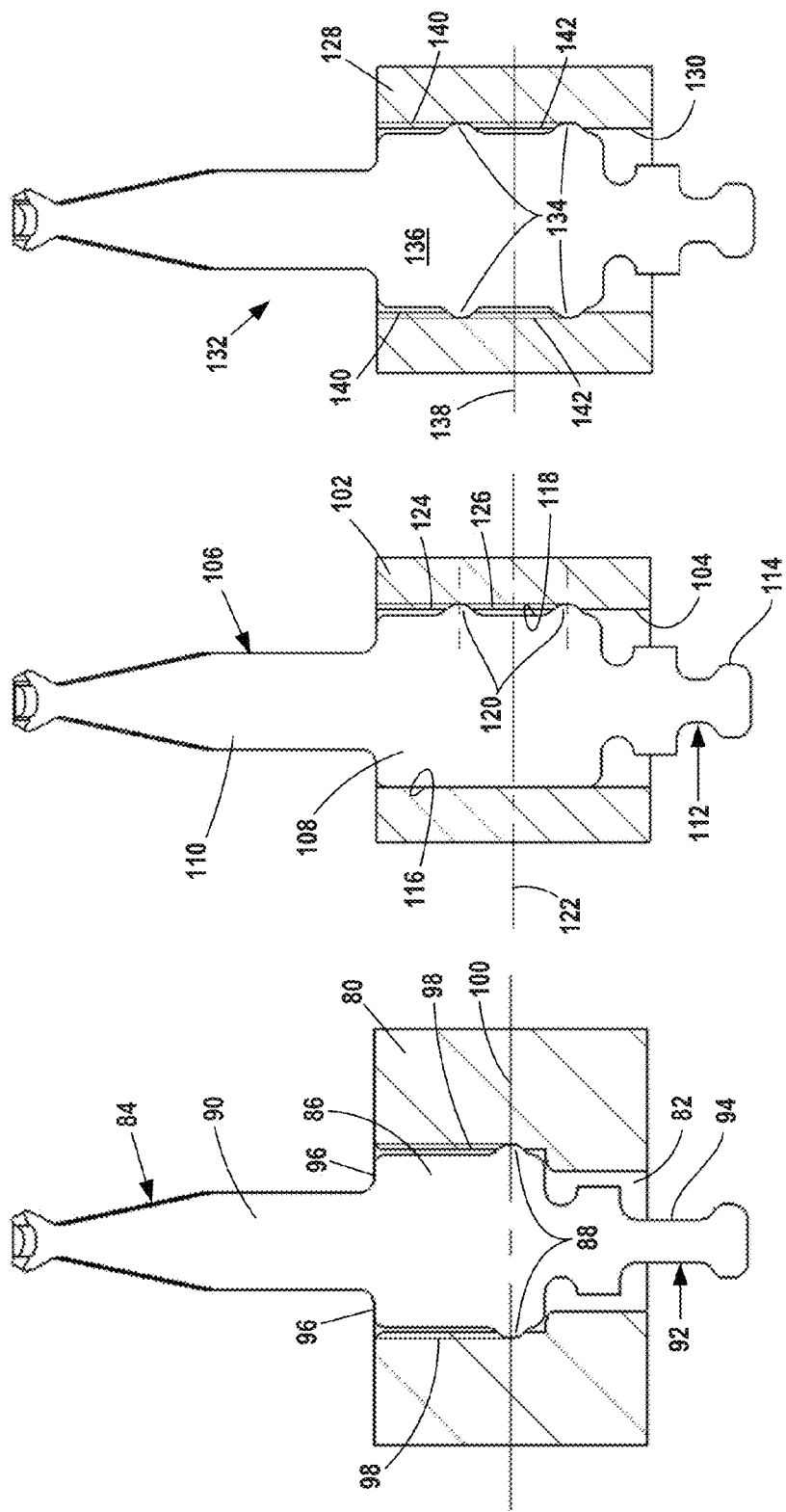

INTERPOSER PLATE

BACKGROUND OF THE DISCLOSURE

Interposer plates with inserted metal contact members in apertures extending through the plates are used for forming electrical connections between contact pads on opposed substrates.

The pads on the substrates and the contact members are typically arranged in closely spaced rows and columns. Each plate may support 3,000 or more contact members. The contact members are inserted in the apertures and must be held in known positions in the apertures in order to assure proper engagement with pads on the substrates and to permit attachment of solder balls. The contact members must be supported in the plates in known locations during attachment of solder balls, during reflow soldering of attached solder balls to form electrical connections with pads on an underlying substrate and during stressing of spring contacts on the contact members to form electrical connections with pads on substrates.

The close spacing of the contact members means there is limited space in the plate for forming physical connections between the plate and contact members inserted in through apertures.

The connections between the contact members and the plate should permit withdrawal of a contact member when the contact member is deformed or needs to be replaced and should permit reinsertion of another contact member in the same aperture.

Also, connections between the contact members and the plate must not bow or vary the shape of the plate. Bowing of the plate alters the vertical positions of contact members in the plate and makes it unsuitable for attachment of solder balls to solder tabs and unsuitable for soldering on a substrate. Additionally, bowing the plate results in unacceptable uneven stressing of cantilever contacts on contact members in the plate and impairs electrical connections between cantilever contacts and substrate pads.

SUMMARY OF THE DISCLOSURE

An improved interposer plate and method for making an interposer plate are disclosed. Contact members are inserted into closely spaced contact apertures in the plate. The contact members have one or more protrusions or recesses which elastically stress resin in the plate during insertion. The elastically stressed resin engages the inserted contact members and forms connections holding the contact members in the apertures.

During insertion of a contact member into an aperture, and during possible withdrawal of a contact member from the aperture and insertion of a replacement contact member, a protrusion or recess on the member moves along a resin band extending along the side of the aperture. The resin in the band is compressed by the moving contact member. When the contact member is fully inserted, the resin in the band partially returns to its original molded shape. There is sufficient elastic recovery in the compressed resin at the protrusion or recess to form a connection retaining the contact member in position during shipping and placement for soldering. Once all contact members are soldered to pads on a substrate, the contact members are robustly retained in position by solder connections at the substrate. The compressed resin at the protrusions or recesses holds the plate on the contact members.

The resin elastically stressed by protrusions or recesses on fully inserted contact members is located either on the central plane for the plate or equidistance above and below the central plane. In this way, the stressed resin does not warp the plate.

DESCRIPTION OF THE DRAWINGS

FIG. 2 is a perspective view of a portion of a plate used in the interposer assembly showing a contact member in position for insertion into an aperture in the plate;

FIG. 3 is a view of the plate shown in FIG. 2 after insertion of the contact member and formation of a solder ball on the bottom of the contact member;

FIG. 5 is a sectional view illustrating the contact member in the plate;

FIG. 8 is a view like FIG. 5 showing the contact member inserted in a different type of aperture in the plate;

FIGS. 9 and 10 are views like FIG. 8 illustrating different contact members;

DETAILED DESCRIPTION OF THE PREFERRED EMBODIMENTS

Figure 1:
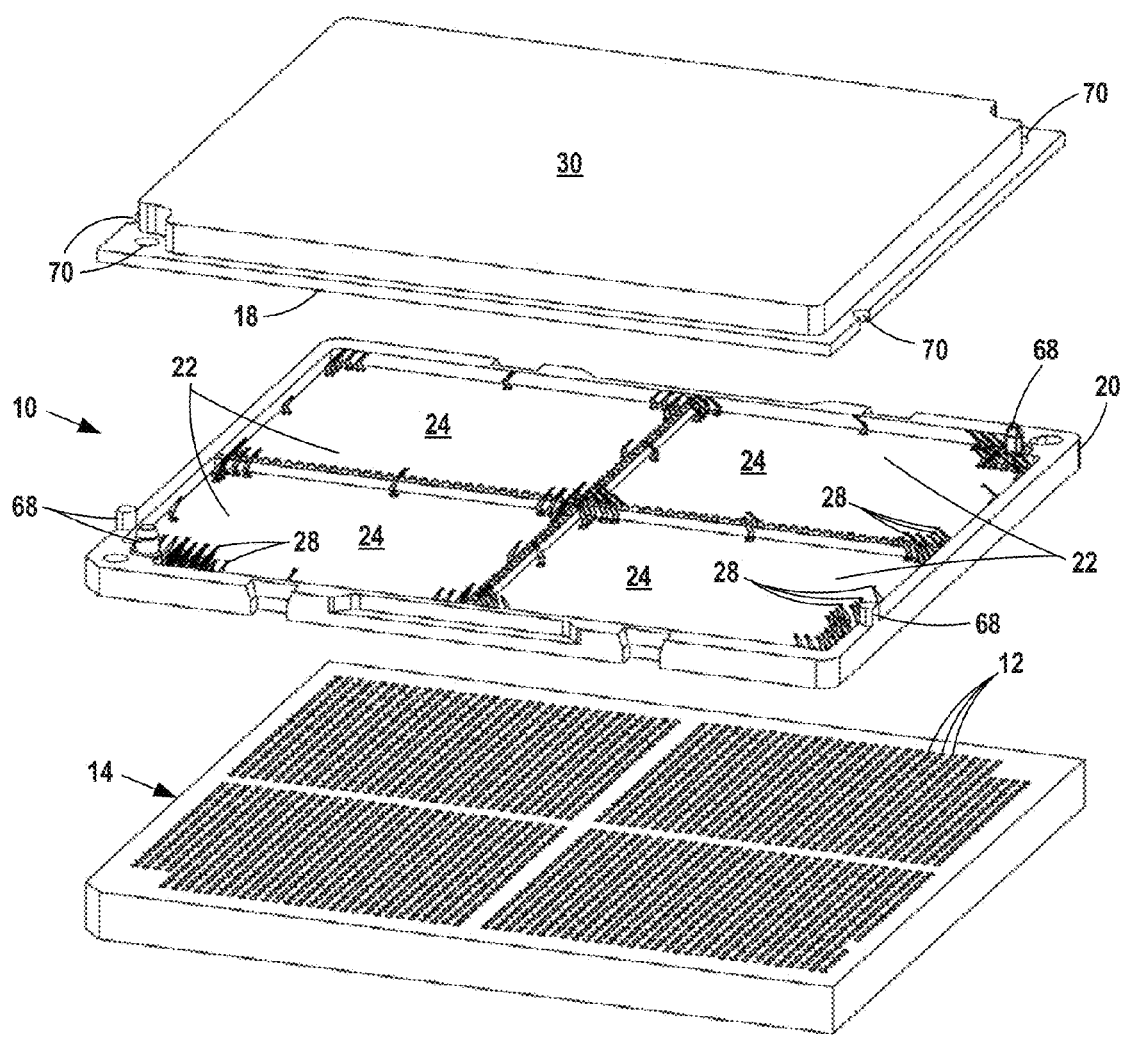
FIG. 1 is an exploded view of an interposer assembly.

FIG. 1 illustrates an interposer assembly or socket assembly 10 for forming a large number of electrical connections between contact pads 12 on the upper surface of lower substrate 14 and corresponding contact pads 16 on the lower surface of upper substrate 18. The pads 12 and 16 are formed in closely spaced ball grid array rows and columns. The pads on both substrates are arranged in quadrants as shown in FIG. 1.

Interposer or socket assembly 10 includes a dielectric frame 20 with four rectangular openings 22. A thin, flat and rectangular interposer plate 24 is mounted in each opening 22. Plate 24 is injection-molded. A large number of contact apertures 26 extend through the thickness of each plate 24. The apertures 26 are arranged in closely spaced ball grid array rows and columns to correspond to rows and columns of pads 12 and 16 on the upper and lower surfaces of substrates 14 and 18. A formed metal contact member 28 is mounted in each aperture 26. Each contact member 28 establishes an electrical connection between a pair of opposed pads 12 and 16.

A processor or other electronic component 30 is mounted on the top of substrate 18 with conductors connected to pads 16. Pads 12 on substrate 14 are connected to other components as required.

Contact member 28 illustrated in FIG. 2 may be stamp-formed or etched from thin, uniform-thickness metal strip stock and may have a thickness of 0.070 mm. Member 28 includes a flat, generally rectangular central portion 32 with opposed, parallel side edges 34, a formed cantilever contact 36 extending upwardly from the top of portion 32 and solder ball contact 38 extending downwardly from the bottom of portion 32.

The cantilever contact 36 is narrower than portion 32 and includes a tapered, reverse bend spring arm 40 with a pair of contact points 42 at the upper end of the arm. The contact points may be of the type disclosed in U.S. Pat. No. 6,730, 134. Other types of arms and contact ends may be used as desired.

Contact member insertion shoulders 46 are located at the top of central portion 32 to either side of contact 36. Solder ball contact 38 includes a solder ball tab 44 at the center of central portion 32.

Two rounded protrusions or bumps 48 extend outwardly from contact side edges 34 at the bottom of central portion 32. The protrusions increase the width of the central portion.

Each contact member 28 is inserted into a contact aperture 26 extending through the plate from plate top surface 50 to bottom surface 52. Contact apertures 26 may be cylindrical about axes perpendicular to the top and bottom surfaces 50 and 52 of flat interposer plates 24 and may have a diameter of 0.650 mm. The size of contact apertures 26 is larger than the solder balls mounted on tabs 44 to allow removal and reinsertion of contacts which have a solder ball attached. Diametrically opposed slots 54 extend into the apertures 26 from top surface 50 a distance slightly below central plane 56. Central plane 56 is equidistant between and parallel to surfaces 50 and 52. The slots 54 may have a width slightly greater than the thickness of contact member central portion 32 and may have a depth of 0.800 mm. The bottoms of slots 54 may be spaced apart a distance 58 of 0.850 mm, slightly greater than the width of central portion 32 away from protrusions 48.

Each protrusion 48 extends a distance out from the adjacent central portion edge 34. The distance may be 0.050 mm. The maximum width of the central portion 32 at protrusions 48 is greater than the distance 58 between the bottoms of slots 54. The end or peak 59 of each protrusion forms and extends into an elastically stressed recess 62 in the resin in the bottom of the adjacent slot 54. The recess extends a distance 78 of 0.006 mm or more into the resin at the bottom of the slot.

In interposer assembly 10, each plate 24 may measure 6.5 cm by 5.5 cm and may include over 3,000 apertures 26 arranged in closely spaced ball grid array rows and columns. The plate may have a thickness of about 1.27 mm. The plate is injection-molded from a suitable resin which may be a glass-filled liquid crystal polymer. Liquid crystal polymer resins are useful in forming interposer assembly plates 24 because the resin can be injection-molded to form large parts with a large number of very accurately molded through apertures. Additionally, glass-filled liquid crystal polymer resins have high temperature stability and are not deformed when heated to high temperatures required to heat-attach lead-free solder balls on solder ball tabs at the lower ends of contact members inserted into the apertures or during heating and melting of the solder balls and reflow soldering of the tabs to pads on an underlying substrate.

FIG. 2 illustrates a contact member 28 positioned above a supported interposer plate 24 in position for insertion into contact aperture 26. The contact members 28 are inserted into apertures 26 in the plate using insertion tooling. Insertion of one contact member into an aperture will be described, it being understood that all contact members on the plate are inserted into apertures in the same manner.

Insertion tooling grips contact 36. Driving surfaces on the tooling engage shoulders 46. The tooling is then lowered onto the plate to move contact member from an insertion position of FIG. 2 to an inserted position of FIG. 5. The driving surfaces on the tooling move shoulders 46 down flush to top surface 50. The central portion 32 of member 28 is aligned with opposed slots 54 in aperture 26 so that the edges of the central portion extend into slots 54, and protrusions 48 engage and are moved down the bottoms of the slots to the fully inserted position shown in FIG. 5 where the protrusions are located on central plane 56.

During insertion of each contact member 28, the protrusions engage the resin at the bottoms of slots 54 as they move from top surface 50 down to the fully inserted positions on plane 56 shown in FIG. 5. The bands 58 are elastically and plastically stressed as the projections move down to center plane 56. After passage of the projections, the deformed resin in the bands partially returns to its initial position, with the exception that the projections 48 extend into deformed recesses 62 at plane 56. The elastically stressed resin engages protrusions 48 to form connections holding the member in the aperture and resist forces that would unseat the contact member from the installed position.

Dimensional tolerances inherent in manufacture of contact members 28 may vary the spacing between projections 48. The resin in plate 24 is deformed by projections 48. The projections extend into the resin a distance, which may be 0.006 mm or more, so that during insertion of the contact member, the resin in each elastically deformable band 78 is compressed. The inserted member is not physically connected to the plate away from protrusions 48.

In the event contact member 28 is withdrawn from aperture 26, protrusions 48 are moved upwardly along bands 58 and deform the resin in the bands. Insertion of a new contact member into aperture 26 again deforms the bands as protrusions 48 are moved down to the insertion position at plane 56, as previously described.

Insertion of a large number of contact members 28 in each plate 24 compresses and stresses the resin in the plate at recesses 62 throughout the plate. The resin remains elastically stressed to hold the contact members in place in the plates. The stressed resin is located at the center of the plate thickness, on plane 56 and does not create a bending force which would warp the plate. The plate retains its molded flat shape despite insertion and retention of a very large number of contact members where the contact members are retained in the plate by elastically stressed resin. Stress bending of the plate is highly undesirable as it shifts the vertical positions of contacts 36 and 38 which adversely affects solder ball bonding, soldering of the balls to pads on substrate 14 and establishing pressure electrical connections with the pads on substrates.

As illustrated in FIG. 5, contact member 28 is inserted into aperture 26 with shoulders 46 at top surface 50 and shoulders 64 at the bottom of central portion 32 closely adjacent to plate stop surfaces 60 at the bottoms of slots 54 to prevent insertion of the contact member below the position shown in FIG. 5. Over insertion would move protrusions 48 below plane 56 with risk that the stressed resin could warp plate 24. Connections with pads on substrates 14 and 18 could be impaired.

After all contact members 28 have been positioned in apertures 26 in plate 24 as illustrated in FIG. 5, spherical solder balls 66 are attached to the solder ball tabs 44 extending below plate bottom surface 52. The solder balls are attached to the tabs using known technology. The LCP resin in plate 24 is not affected by the high temperature required to attach lead-free solder balls 66.

Figure 4:
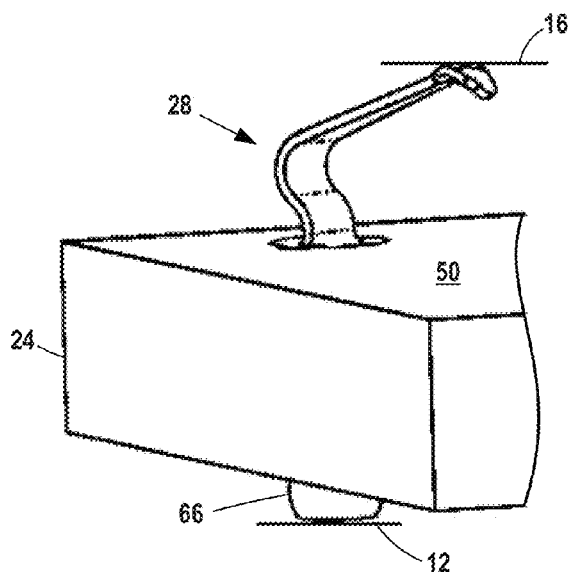
FIG. 4 is a view illustrating sandwiching of the plate between pads on upper and lower substrates.

Interposer plates 24, with contact members inserted in apertures 26 and solder balls 66 on tabs 44, are positioned in the four quadrant openings 22 in frame 20. The frame, with the interposer plates, is accurately positioned on lower substrate 14 with each solder ball engaging a pad 12 as illustrated in FIG. 4. The solder balls are then heated to melt the solder balls and, upon cooling of the solder, form individual reflow solder connections between pads 12 and contact members 28.

Figure 7:
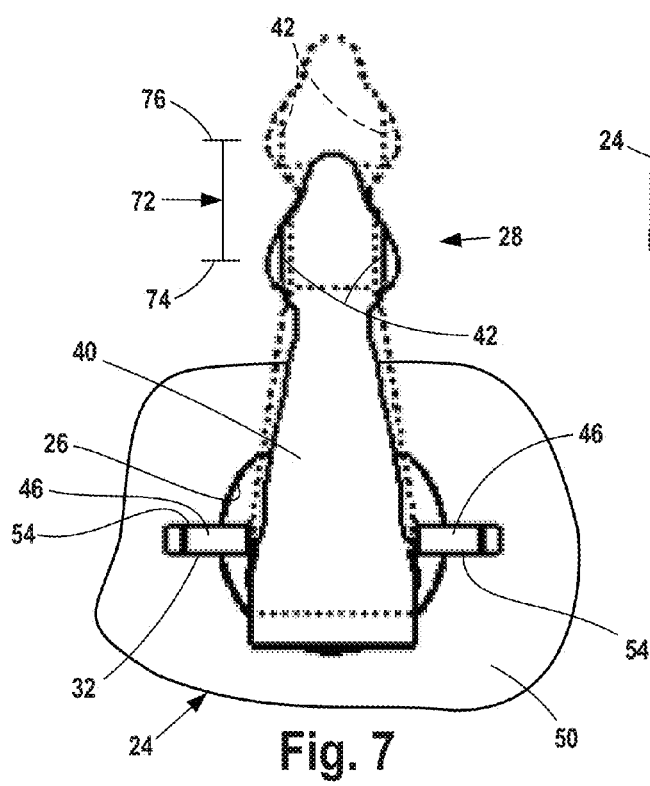
FIG. 7 is a top view of the contact member illustrated in FIG. 4.

After soldering of the contact members 28 in assembly 10 to the pads 12 on lower substrate 14, upper substrate 18 is positioned above assembly 10 with upwardly extending alignment members 68 on frame 20 engaging corresponding openings and recesses 70 on the substrate to locate the substrate on the assembly accurately and assure that the contact points 42 of each contact member are located immediately under an appropriate pad 16 on the lower surface of substrate 18. The substrate 18 and processor 30 are then moved down toward frame 20 so that the contact points 42 on the contact members 28 engage the pads on substrate 18, the cantilever contacts 36 are resiliently deflected down toward plates 24, and the points 42 move a distance along the pad to form reliable, wiped electrical connections with the pads. FIG. 7 illustrates that when the springs arms 40 are compressed, the contact points 42 move a distance 72 from start position 74 to end position 76. The upper substrate 18 is secured in the lowered position to maintain electrical connections between pads 12 and 16 on substrates 14 and 18.

The interior diameter of cylindrical contact aperture 26 is larger than the diameter of the solder ball 66 formed on contact 38. This means that, if necessary, a defective contact member 28, with or without an attached solder ball, can be withdrawn from plate 24 by physically engaging contact 36 and pulling the member up and out of the aperture. Protrusions 48 are moved upwardly and out from slots 54 without physical injury to the resin, as previously described. The elastically stressed resin expands.

Figure 6:
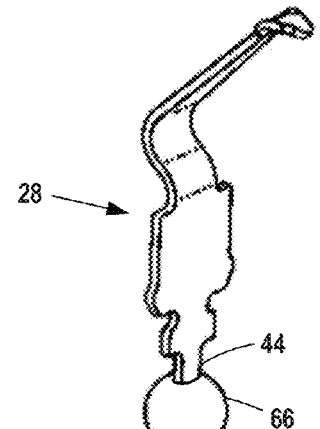
FIG. 6 is a view similar to FIG. 2 illustrating a contact member with an attached solder ball positioned for insertion into an aperture in the plate.

Another contact member 28, with solder ball 66 attached to tab 44, is then inserted into the empty aperture 26, as previously described, to replace the defective contact member. See FIG. 6. The protrusions 48 on the replacement contact members extend into elastically stressed recesses 62 in the plate to retain the contact in the plate as shown in FIG. 5. Solder ball 66 moves freely through aperture 26 to the bottom of the plate.

FIG. 8 illustrates interposer plate 80 which is like plate 24 with the exception that contact apertures 82 are cylindrical and do not have opposed slots 54 as used in apertures 26. Contact members 84, which may be like members 28, have rectangular central portions 86 and opposed protuberances or bumps 88 at the bottom edges of the central portions. Cantilever contact 90 extends above the top of portion 86. Solder ball contact 92 extends below the bottom of the central portion and may be a solder tab 94.

The width of the central portion 86 at protrusions 88 is slightly greater than the diameter of aperture 82. During insertion of contact member 84 into aperture 82, tooling inserts the contact until shoulders 96 are flush with the top of plate 80, as previously described. Protrusions 88 compress resin bands 98 extending along opposite sides of the aperture 82 from the top of the aperture to the bottoms of the bands during insertion. As illustrated in FIG. 8, when contact member 84 is fully inserted, protrusions 88 are located on central plane 100. Bands 98 may have a thickness of about 0.006 mm, like bands 78. The compressed resin at protrusions 88 holds contact member 84 in aperture 82, as previously described. The stressed resin in plate 80 at the recesses formed by protrusions 88 is located on central plane 100 and does not warp plate 80.

Solder balls are attached to solder tabs 94, as previously described. Individual contact members 84 may be removed from aperture 82 for replacement, as previously described.

FIG. 9 illustrates an interposer plate 102, like plate 80, with cylindrical contact apertures 104. Contact member 106 is similar to prior-described contact members and includes a generally rectangular central portion 108, a cantilever contact 110 extending upwardly from the top of portion 108, and a solder contact 112, which may be tab 114, extending down from the bottom of the central portion. Central portion edge 116 is flat and has a sliding engagement with the adjacent wall of aperture 114. Two spaced protrusions 120 are located on opposite edge 118 equidistant above and below central plane 122.

Resin in band 124 is compressed during insertion of member 106 into aperture 104. Lower protrusion 120 compresses and stresses the resin in upper and lower bands 124 and 126 during insertion. Upper protrusion 120 compresses and stresses the resin in upper band 124 only. The elastically stressed resin in the recesses at the protrusions holds member 106 in place in plate 102.

The two protrusions 120 are located equidistance above and below central plane 122 so that the stressed resin at the recesses formed by the protrusions 120 is equidistant above and below the plane and does not warp plate 102.

FIG. 10 illustrates interposer plate 128 which is like plates 80 and 102. Cylindrical contact apertures 130 extend through plate 128. Contact member 132 is like contact member 106 with the exception that a pair of protrusions 134 is provided on each edge of central portion 136. Each pair of protrusions 134 is located equidistant to either side of central plane 138. During insertion of contact member 132 into aperture 130, upper protrusions 134 compress and stress the resin in upper bands 140, and lower protrusions 134 compress and stress the resin in both upper bands 140 and lower bands 142, as described in connection with insertion and withdrawal of contact member 106 from plate 102 illustrated in FIG. 9. The elastically compressed resin holds the protrusions in place in the plate. The pairs of protrusions on each side of the central portion compress resin at locations equidistant above and below the central plane so that the elastically stressed resin does not alter the shape of plate 128.

Figure 11:
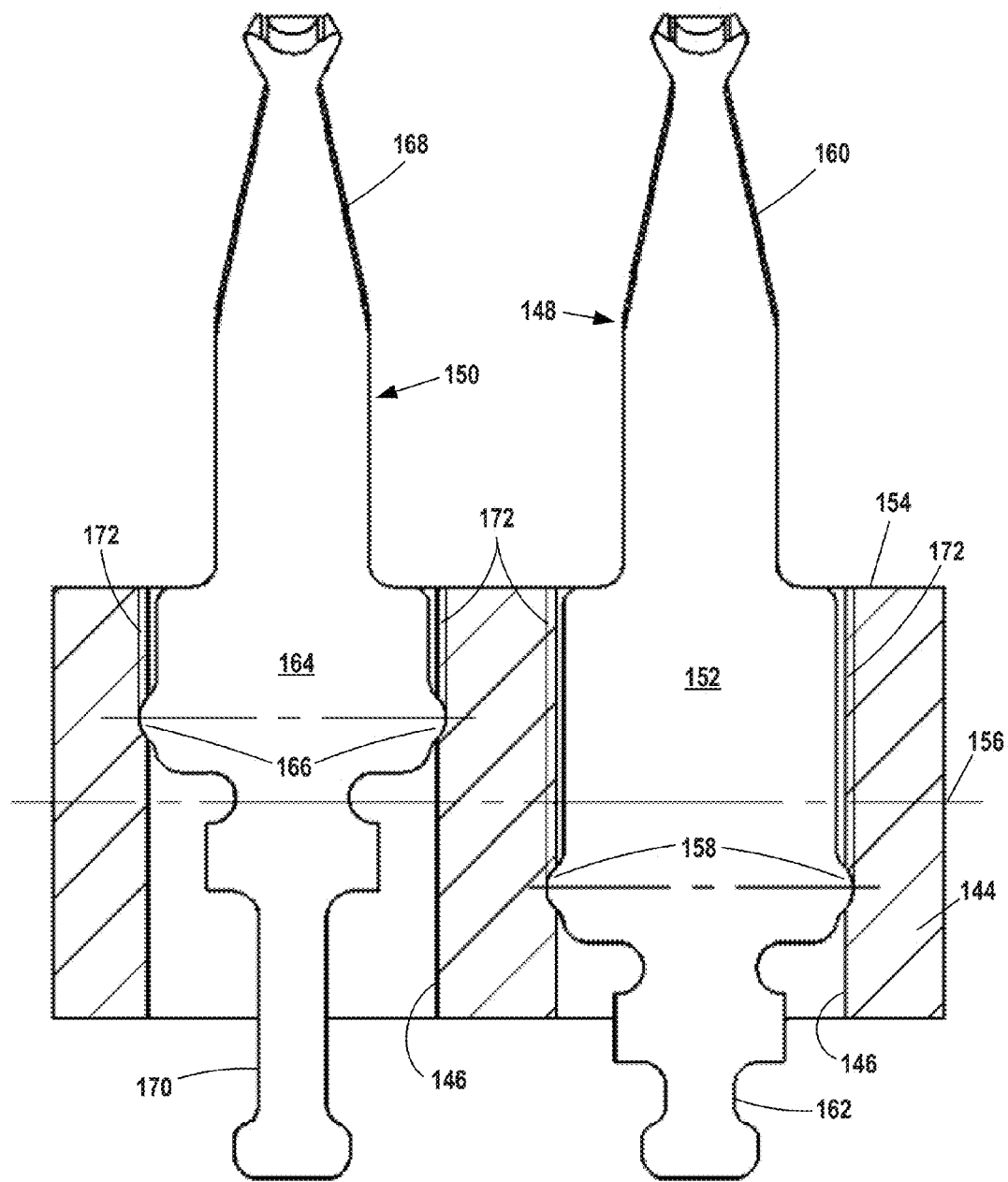
FIG. 11 is a view illustrating two different contact members inserted in adjacent apertures in a plate.

FIG. 11 illustrates interposer plate 144 having adjacent apertures 146 extending through the thickness of the plate. Apertures 146 may be located in the same row or column of apertures in the ball grid array of apertures on the plate. Alternatively, the apertures may be located in adjacent rows or columns or in a row and a column.

Contact member 148 is positioned in one aperture 146, and contact member 150 is positioned in the adjacent aperture 146. The contact members 148, 150 are related to contact member 84 illustrated in FIG. 8.

Contact member 148 includes a rectangular central portion 152, similar to portion 86, with the exception that portion 152 extends down from plate top surface 154 past central plane 156 and includes protrusions or bumps 158 extending outwardly from the edges of the central portion located a distance below the central plane.

Contact member 150 includes a rectangular central portion 164 with protrusions 166 extending from opposed sides of the central portion and located a distance above plane 156. Protrusions 166 are located a distance above plane 156 equal to the distance protrusions 158 are located below plane 156. Cantilever contact 168 is like contact 90. Solder contact 170 is like contact 92.

Contact members 148 and 150 are inserted into apertures 146 as previously described. The bumps or protrusions 158 and 166 extend into the resin at the opposite sides of the apertures and deform resin bands 172. Bands 172 for contact member 148 extend from top surface 154 past central plane 156 to projections 158. Bands 172 for contact member 150 extend from top surface 154 down to projections 166. Projections 158 and 166 on both contact members elastically compress resin at the projections. The compressed resin holds the contact members in plate 144, as previously described.

Protrusions 158 and 166 are located equidistance above and below central plane 156. The two contact members 148 and 150 are located close together on plate 154. The plate includes a large number of paired contacts 148, 150 with protrusions 158, 166 which compress the resin in the plate at equal distances above and below the central plane. The result is that the stresses in the resin above and below the plane 156 are equal so that the stresses do not deform the flat plate 144.

Cylindrical apertures extend through the plates of FIGS. 9, 10 and 11. Cylindrical apertures permit insertion of contact members at a desired angular orientation in the apertures around a vertical axis.

Figure 12:
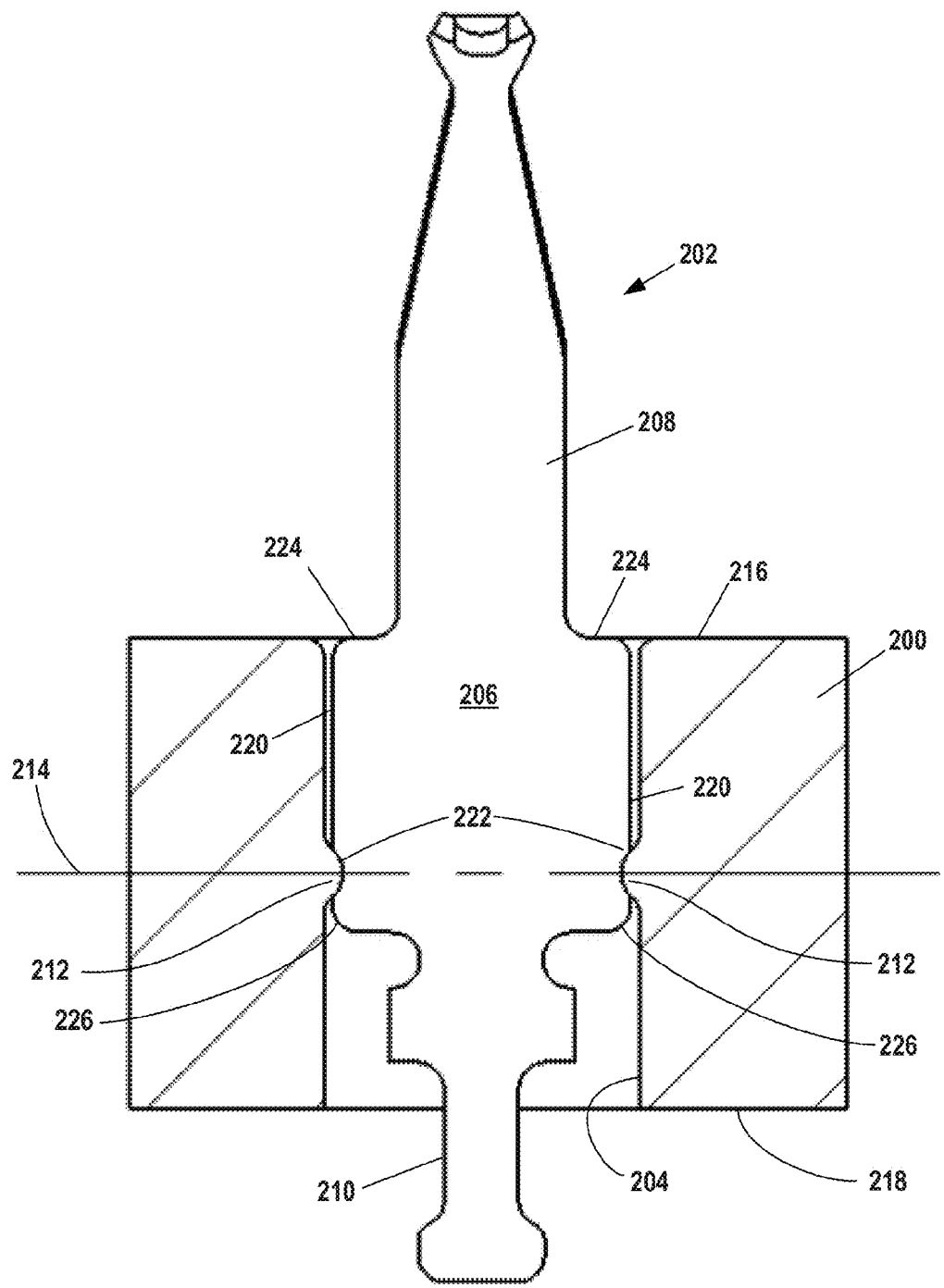
FIG. 12 is a view like FIG. 5 illustrating a different contact member in a plate.

FIG. 12 is similar to FIG. 5 and illustrates an interposer plate 200, similar to plate 24, with contact member 202 removably mounted in contact aperture 204. Plate 200 is like the previously described plates and includes a large number of apertures 204 arranged in a ball grid array rows and columns. Contact 202 may be formed from the same thickness metal strip stock used to form contacts 28.

The contact member 202 includes central portion 206, like central portion 32, upper cantilever contact 208, like contact 36 and lower solder ball contact 210, like contact 38. The contact aperture 204 may be cylindrical.

The contact aperture 204 includes an integrally molded pair of opposed resin protrusions 212 located on the central plane 214. Plane 214 is located equidistance between top surface 216 and bottom surface 218 and is parallel to the surfaces.

The central portion 206 of contact member 202 includes opposed side edges 220, like edges 34, and a recess 222 on each edge located at plane 214. The resin in protrusions 212 is compressed in recesses 222. When molded, the protrusions 212 extend a distance further away from the aperture than as illustrated in FIG. 12.

The protrusions 212 may be located on an interior protrusion ring extending around the circumference of aperture 204. Protrusion rings facilitate insertion of members 202 in the apertures at a desired angular orientation in the aperture around a vertical axis.

Contact members 202 are inserted into apertures 204 in plate 200 from top surface 216, as previously described. Tooling engages insertion shoulders 224 which are flush with the top surface 216 when the contact members are fully inserted into the apertures.

During insertion of the contact member, rounded corners 226 at the bottom of edges 220 engage and compress protrusions 212 as the side edges 220 move past the resin in the protrusions. The protrusions expand into rounded recesses 222 which are located above corners 226. With the contact members in the position shown in FIG. 12, the resin in protrusions 212 is elastically compressed and tightly engages the recesses 222 to form physical connections securing the contact members in the plate and to prevent dislodgement of contact members from the aperture. The contact members 202 are inserted into apertures 204 by elastically compressing the protrusions 212 without injury to the protrusions. The corners 226 and recesses 222 are rounded to prevent injury to the resin.

The diameter of aperture 204 may be reduced to provide slots, similar to slots 54, extending from protrusions 212 to the top surface 216.

A contact member 202 may be withdrawn from plate 200 as previously described by gripping contact 208 and pulling the contact member from the aperture. Withdrawal of the contact member elastically compresses the protrusions 212. Upon withdrawal, the protrusions expand to their uncompressed shape. Another contact member may then be inserted into the aperture, as previously described.

Cylindrical apertures extend through the disclosed interposer plates. Uniform cross section cylindrical apertures can be spaced together closely to facilitate dense mounting of contact members on the plates. The apertures may have other shapes and may have non-circular interior cross sections if desired.

The disclosed contact members have a spring contact on one side of the plate in which the member is inserted and a solder contact on the opposite side of the plate. After insertion of contact members, the plates are processed to attach solder balls to the solder contacts and are then soldered to pads on an underlying substrate. If desired, the angled cantilever arms on the top of the contact member may be replaced by other types of contacts.

The contact members 28, 84, 106, 132, 148, 150 and 202 include depressing portions in the form of protrusions or recesses which engage and elastically compress resin in apertures to form connections mounting the contact members in the plates.

Contact members are inserted into the plates, compress resin in the plates and are held in the plates by the compressed resin. The members can be withdrawn from the plates and replacement members can be inserted and are held in the plates by compressed resin. Insertion of a member may slightly wear or abrade the softer resin but does not prevent withdrawal of the member, insertion of a replacement member and compression retention of the replacement member in the plate.

If desired, the solder contacts at the bottom of each contact member may be replaced by spring contacts, such as a spring arm for resiliently engaging an underlying pad without solder connection, or a contact abutment for engaging an underlying contact pad or other types of contacts.

Accordingly, the disclosure is not limited to interposer plates where the inserted contact members include cantilever contacts, solder contacts or tabs but includes plates with contacts for forming other types of electrical connections with pads above and below the plate.

What I claim as my invention:

1. An interposer assembly for forming electrical connections between contacts on opposed substrates, the interposer assembly comprising, a flat plate formed of thermoplastic resin, the plate having opposed flat and parallel top and bottom surfaces and a uniform thickness, a central plane located equidistant between the top and bottom surfaces, and a plurality of contact apertures extending through the thickness of the plate, said apertures arranged on the plate in intersecting rows and columns, each aperture having opposed aperture walls and an elastically depressed recess in an aperture wall; and a plurality of contact members, each contact member having a substantially flat central portion in a contact aperture, an upper contact portion extending upwardly from the central portion toward the plate top surface and a lower contact portion extending downwardly from the central portion toward the plate bottom surface, the central portion having opposed side edges engaging the aperture walls and one or more rounded contact protrusions on a first side edge, each protrusion extending a distance into an aperture wall and elastically stressing resin in the aperture wall to form the recess in the aperture wall and exert a stress force on the plate; the total of the stress forces exerted on the plate by the contact protrusions being essentially zero at the central plane so that the plate is substantially flat.

2. The assembly as in claim 1 wherein the plate has a thickness of about 1.27 mm.

3. The assembly as in claim 2 where in the apertures are cylindrical and have a diameter of about 0.65 mm.

4. The assembly as in claim 1 wherein each contact member includes one or more rounded protrusions on a second side edge, each such protrusion engaging and elastically stressing the resin in an aperture wall.

5. The assembly as in claim 4 including opposed slots in each contact aperture, each slot extending to one side of the plate, said contact member side edges in said slots.

6. The assembly as in claim 1 wherein said apertures are generally cylindrical.

7. The assembly as in claim 6 wherein each contact member has a uniform thickness and includes a spring contact.

8. The assembly as in claim 7 wherein each aperture has a diameter of about 0.65 mm, and each contact member has a thickness of about 0.07 mm.

9. The assembly as in claim 8 including a solder ball on each contact member.

10. The assembly as in claim 1 wherein each contact member includes an insertion surface and a shoulder, each aperture includes a stop surface aligned with said shoulder and facing the top surface, each shoulder is flush with the top surface of the plate, and the shoulder is adjacent the stop surface.

11. The assembly as in claim 1 wherein said contact protrusions are either located on the central plane or are located on opposite sides of the central plane.

12. An assembly for forming electrical connections between contacts on opposed substrates, the assembly comprising a flat plate formed from molded thermoplastic resin, the plate having a uniform thickness, parallel top and bottom surfaces and a plurality of contact apertures extending through the thickness of the plate between the top and bottom surfaces, said apertures arranged in closely spaced rows and columns, each aperture having opposed aperture walls and a first elastically compressed retention portion extending into on an aperture wall; and a plurality of metal contact members, each contact member comprising a substantially flat central portion with side edges, an upper contact extending up from the central portion, a lower contact extending down from the central portion, and a first depressing portion on a side edge, the central portion in a contact aperture and engaging the opposed aperture walls, the first depressing portion engaging and extending into the retention portion to maintain the retention portion elastically compressed and deformed outwardly of the aperture, the first depressing portion and the retention portion forming a first physical connection holding the contact member in the aperture and to permit non-destructive withdrawal of the contact member from the aperture wherein each depressing portion is concave.

13. The assembly as in claim 12 wherein each retention portion is convex.

14. The assembly as in claim 12 wherein each aperture includes an elongate elastically compressible band extending from the retention portion to one plate surface.

15. The assembly as in claim 12 including a slot in each aperture, a band at the bottom of each slot.

16. The assembly as in claim 12 wherein each contact member includes a second depressing portion, said first and second depressing portions on opposite side edges of the central portion, and each aperture wall includes a second elastically compressed retention portion; said second depressing portions and said second retention portions forming second physical connections holding the contact members in the apertures.

17. The assembly as in claim 12 wherein the depressing portions are located either on or equally above and below a plane equidistant between the surfaces.

18. The assembly as in claim 12 wherein each contact member includes an insertion surface and a stop surface adjacent a shoulder in an aperture.

19. An assembly for forming electrical connections between contacts on opposed substrates, the assembly comprising a flat, uniform thickness plate formed from molded thermoplastic resin, the plate comprising parallel top and bottom surfaces and a plurality of contact apertures extending through the plate between the top and bottom surfaces, the contact apertures arranged on the plate in intersecting rows and columns, each aperture having opposed aperture walls; a plurality of metal contact members in the apertures, each contact member comprising a central portion having side edges, an upper contact extending up from the central portion and a lower contact extending down from the central portion, the central portion in a contact aperture with the side edges engaging opposed aperture walls; and means for resiliently retaining the central portions of the contact members in the contact apertures by elastically stressing resin in the aperture sidewalls without bowing the plate and for nondestructive insertion of the central portions into the contact apertures said means including an elastically deformable strip of thermoplastic resin on one side of each aperture.

20. The assembly as in claim 19 wherein said means includes an elastically deformed recess in each contact aperture and a contact protrusion on each contact member, the contact protrusions extending into the recesses.

21. The assembly as in claim 19 wherein the means includes an elastically deformed protrusion in each contact aperture wall and a contact recess on each contact member, the recesses surrounding and elastically stressing the protrusions.

22. The assembly as in claim 19 wherein said means are located either on a plane equidistant between the top and bottom surfaces of the plate or equidistant above and below the plane and the plate is flat.

23. A method of mounting metal contact members in a dielectric plate, comprising the steps of:
  a) providing a flat plate formed of dielectric resin and having a uniform thickness, opposed, parallel top and bottom surfaces and a plurality of contact apertures extending through the thickness of the plate with the apertures arranged on the plate in intersecting rows and columns;
  b) providing a plurality of metal contact members with each contact member having a substantially flat central portion and upper and lower contact portions;
  c) inserting a contact member in into each contact aperture central portion to elastically and non-destructively compress resin in the aperture wall and form a resilient physical connection between the plate and the central portion which retains the inserted central portion in the aperture and exerts a stress force on the plate; and
  d) locating the elastically compressed resin at each physical connection either on or to either side of a central plane equidistant between the plate top and bottom surfaces to prevent warpage of the plate by the stress forces and
  e) elastically and non-destructively stressing a band of resin in each aperture during movement of each contact member into the aperture.

* * * * *